US012799594B2

United States Patent
(12) United States Patent
Innocent et al.

(10) Patent No.: US 12,799,594 B2
(45) Date of Patent: Nov. 17, 2026

(54) FIELD-ASSISTED THERMAL CYCLICAL VAPOR DEPOSITION OF A HZO FILM

(71) Applicant: ASM IP Holding B.V., Almere (NL)

(72) Inventors: Jerome Innocent, Bristol (GB); Andrea Illiberi, Leuven (BE); Leo Lukose, Leuven (BE); YongGyu Han, Leuven (BE); Matthew Surman, Helsinki (FI)

(73) Assignee: ASM IP Holding B.V., Almere (NL)

( * ) Notice: Subject to any disclaimer, the term of this patent is extended or adjusted under 35 U.S.C. 154(b) by 196 days.

(21) Appl. No.: 18/792,680

(22) Filed: Aug. 2, 2024

(65) Prior Publication Data

US 2025/0043419 A1 Feb. 6, 2025

Related U.S. Application Data

(60) Provisional application No. 63/517,517, filed on Aug. 3, 2023.

(51) Int. Cl.

| | |
|---|---|
| ***C23C 16/455*** | (2006.01) |
| ***C23C 16/40*** | (2006.01) |
| ***C23C 16/458*** | (2006.01) |
| ***C23C 16/46*** | (2006.01) |
| ***C23C 16/52*** | (2006.01) |
| ***C23C 16/56*** | (2006.01) |

(52) U.S. Cl.

CPC ...... *C23C 16/45536* (2013.01); *C23C 16/405* (2013.01); *C23C 16/45565* (2013.01); *C23C 16/458* (2013.01); *C23C 16/46* (2013.01); *C23C 16/52* (2013.01); *C23C 16/56* (2013.01)

(58) Field of Classification Search

None

See application file for complete search history.

(56) References Cited

U.S. PATENT DOCUMENTS

| | | | | |
|---|---|---|---|---|
| 10,147,610 | B1 * | 12/2018 | Lingampalli | C23C 16/4586 |
| 11,778,809 | B1 * | 10/2023 | Yang | H10D 1/716 257/296 |
| 2008/0230854 | A1 * | 9/2008 | Clark | H10D 64/01342 257/E29.345 |
| 2010/0024732 | A1 * | 2/2010 | Mokhlesi | C23C 16/4401 118/724 |
| 2023/0203661 | A1 * | 6/2023 | Oh | H01J 37/32724 427/569 |
| 2024/0222195 | A1 * | 7/2024 | Huang | H10D 30/6757 |
| 2024/0412957 | A1 * | 12/2024 | Pisharody | H01J 37/32724 |

FOREIGN PATENT DOCUMENTS

| | | |
|---|---|---|
| CN | 111763917 | * 10/2010 |
| JP | H05109655 | * 4/1993 |
| KR | 20220042911 | * 4/2022 |
| KR | 20230048000 | * 4/2023 |

* cited by examiner

*Primary Examiner* — Mandy C Louie

(74) *Attorney, Agent, or Firm* — Banner & Witcoff, Ltd.

(57) ABSTRACT

A method for forming a film comprising hafnium, zirconium, and oxygen, the method comprising forming the film by a cyclical vapor deposition process under the effect of an electric field.

15 Claims, 8 Drawing Sheets

FIELD-ASSISTED THERMAL CYCLICAL VAPOR DEPOSITION OF A HZO FILM

CROSS-REFERENCE TO RELATED APPLICATION(S)

This Application claims the benefit of U.S. Provisional Application 63/517,517 filed on Aug. 3, 2023, the entire contents of which are incorporated herein by reference.

FIELD OF THE INVENTION

The invention relates to the field of thermal cyclical vapor deposition, and more specifically for creating films comprising hafnium, zirconium, and oxygen.

BACKGROUND OF THE INVENTION

Ferroelectric memory devices have shown great potential for high-speed read and write operations, low power consumption, and high retention. Hafnium oxide-based thin films have emerged as promising materials for ferroelectric memory applications, offering excellent compatibility with complementary metal-oxide-semiconductor (CMOS) fabrication processes. However, traditional deposition methods for hafnium oxide-based thin films often result in multiphase films with inconsistent ferroelectric properties, leading to non-uniform device performance.

CN111554568 describes a method for preparing a hafnium oxide-based thin film, with doped hafnium oxide films considered to have ferroelectricity. The doped other elements mentioned include Zr, among others. The method includes depositing a hafnium oxide-based thin film on a substrate and annealing it in an electric field using an annealing device. During the annealing process, an electric field is selectively applied at different time periods, including during heating, maintaining temperature, and cooling. The application of the electric field helps to control the energy field in the crystallization process of the thin film, resulting in improved quality and uniformity of the ferroelectric thin film.

However, this method requires many steps, including depositing a hafnium oxide-based thin film on a substrate, providing the film in a deposition tool, applying a covering layer on the film's surface, providing the covered layer in an electric field device, annealing it in the electric field device with three different time periods (heating, maintaining temperature, and cooling), and selectively applying an electric field during each phase.

There is therefore a need in the art for streamlined and efficient methods and systems for producing hafnium zirconium oxide-based ferroelectric thin films.

SUMMARY OF THE INVENTION

It is an object of the present invention to provide good methods and systems for forming a film comprising hafnium, zirconium, and oxygen.

The above objective is accomplished by a method and a system according to the present invention.

In a first aspect, the present invention relates to a method for forming a film comprising hafnium, zirconium, and oxygen, the method comprising forming the film by a thermal cyclical vapor deposition process under the effect of an electric field.

In a second aspect, the present invention relates to a thermal cyclical vapor deposition system, e.g., a thermal atomic layer deposition system comprising a reactor adapted for forming a film comprising hafnium, zirconium, and oxygen, by thermal cyclical vapor deposition, e.g., by thermal atomic layer deposition and comprising:

- an electric field generator configured to generate an electric field during the formation of the film; and
- a controller configured to pilot the thermal cyclical vapor deposition, e.g. the thermal atomic layer deposition of the film and to operate the electric field generator to generate an electric field during the thermal cyclical vapor deposition, e.g., the thermal atomic layer deposition.

In a third aspect, the present invention relates to a computer program comprising instructions to cause the system of the second aspect to execute the steps of the method of the first aspect.

In a fourth aspect, the present invention relates to a computer-readable medium having stored thereon the computer program of the third aspect.

It is an advantage of embodiments of the present invention that high-quality zirconium hafnium oxide-based films with very good uniformity can be obtained.

It is an advantage of embodiments of the present invention that orthorhombic zirconium hafnium oxide-based films having good ferroelectric properties can be obtained. It is an advantage of embodiments of the present invention that they enable the precise control of the deposition process and the electric field application, thereby enabling consistent and reproducible film formation.

It is an advantage of embodiments of the present invention that they enable an efficient deposition. The use of an electric field during a thermal cyclical vapor deposition process, e.g. during thermal atomic layer deposition, favor the formation of the orthorhombic phase already during the layer deposition process. This led to faster orthorhombic film formation, reducing production time and costs.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change, and evolution of devices in this field, the present concepts are believed to represent substantial new and novel improvements, including departures from prior practices, resulting in the provision of more efficient, stable, and reliable devices of this nature.

The above and other characteristics, features, and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
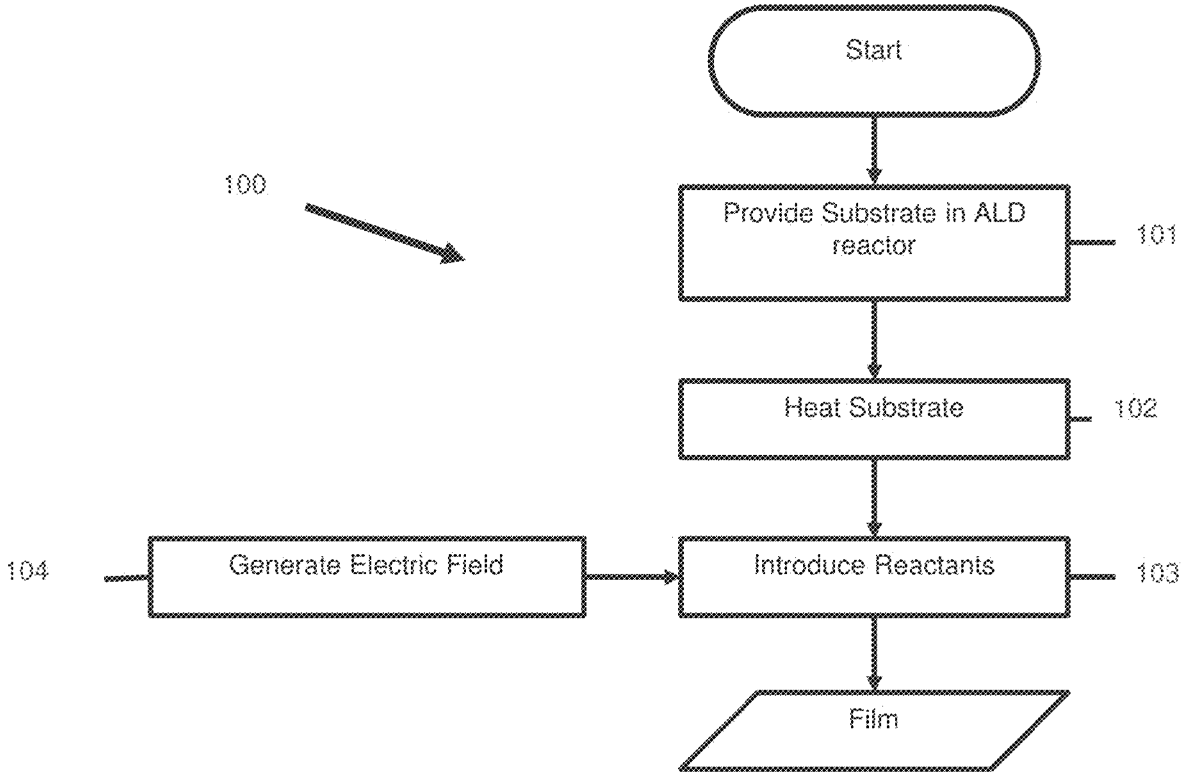
FIGS. 1-5 show flowcharts of methods according to embodiments of the present invention.

In the different figures, the same reference signs refer to the same or analogous elements.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third, and the like in the description and in the claims, are used for distinguishing between similar elements and not necessarily for describing a sequence, either temporally, spatially, in ranking, or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps, or components as referred to, but does not preclude the presence or addition of one or more other features, integers, steps or components, or groups thereof. The term "comprising" therefore covers the situation where only the stated features are present (and can therefore always be replaced by "consisting of" in order to restrict the scope to said stated features) and the situation where these features and one or more other features are present. The word "comprising" according to the invention therefore also includes as one embodiment that no further components are present. Thus, the scope of the expression "a device comprising means A and B" should not be interpreted as being limited to devices consisting only of components A and B. It means that with respect to the present invention, the only relevant components of the device are A and B.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures, or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures, and techniques have not been shown in detail in order not to obscure an understanding of this description.

We now refer to FIGS. 1-5 and in particular to FIG. 1. In the first aspect, the present invention relates to a method (100) for forming a film comprising hafnium, zirconium, and oxygen, the method comprising forming the film by a thermal cyclical vapor deposition process, e.g., by thermal atomic layer deposition, under the effect of an electric field (13).

The film may have any surface area but the method of the first aspect is particularly well suited for forming films of large surface area and in particular homogeneous films of large surface area. In embodiment, the surface area of the film may measure at least 300 $cm^2$, preferably at least 700 $cm^2$.

The film produced by the method according to the first aspect has typically ferroelectric properties. In other words, it is typically a ferroelectric film.

The film produced by the method according to the first aspect has typically a crystallinity which is at least 50% orthorhombic, preferably at least 60% orthorhombic, more preferably at least 70% orthorhombic, yet more preferably at least 80% orthorhombic, and most preferably at least 90% orthorhombic.

The film produced by the method according to the first aspect is typically uniform across its surface and across its thickness.

The film produced by the method according to the fist aspect typically has a k-value of at least 40, preferably at least 50.

The film comprises hafnium, zirconium, and oxygen. In embodiments, the atomic proportion of hafnium and zirconium may be from 40:60 to 60:40, preferably from 45:55 to 55:45. Most preferably, it is 50:50.

In embodiments, the cations present in film may consist for at least 95%, preferably at least 99% in hafnium and zirconium, and most preferably 100% hafnium and zirconium. Examples of other cations that can enter the composition of the film are Si, Al, La, Y, N, Gd, Sr, Ce, Fe, Sc, Ge, Lu, Ta, and Ti, amongst others.

In embodiments, the anions present in film may consist for at least 95%, preferably at least 99%, and most preferably 100% in oxygen. Examples of other anions that can enter the composition of the film are N, S, and F, amongst others.

The atomic ratio between anions and cations in the film is typically from 1.9 to 2.1 and preferably 2.0.

In preferred embodiments, the composition of the film may consist of anions and cations in an atomic ratio of from 1.9 to 2.1, wherein at least 95% of the cations are a mixture of hafnium and zirconium in atomic proportions of from 40:60 to 60:40, and wherein at least 95% of the anions are oxygen anions.

In more preferred embodiments, the composition of the film may consist of anions and cations in an atomic ratio of 2, wherein at least 95% of the cations are a mixture of hafnium and zirconium in atomic proportions of from 40:60 to 60:40, and wherein at least 99% of the anions are oxygen anions.

In even more preferred embodiments, the composition of the film may consist of anions and cations in an atomic ratio of 2, wherein at least 95% of the cations are a mixture of hafnium and zirconium in atomic proportions of from 45:55 to 55:45, and wherein at least 99% of the anions are oxygen anions.

In yet even more preferred embodiments, the composition of the film may consist of anions and cations in an atomic ratio of 2, wherein at least 99% of the cations are a mixture of hafnium and zirconium in atomic proportions of from 45:55 to 55:45, and wherein at least 99% of the anions are oxygen anions.

In the most preferred embodiment, the composition of the film is $Hf_{0.5}Zr_{0.5}O_2$.

The method of the first aspect comprises forming (100) the film by a thermal cyclical vapor deposition process.

As used herein, a cyclical vapor deposition process refers to the sequential introduction of gaseous precursors and/or reactants into a chamber of a reactor to deposit a layer over a substrate.

A thermal cyclical vapor deposition process is a cyclical vapor deposition process wherein precursors and/or reactants are sequentially introduced into a chamber of a reactor to deposit a layer over a substrate heated to a temperature conductive to allow the precursors and/or reactants to react on a deposition surface of the substrate. The term "thermal" signifies that the heating of the substrate enables the precursors and/or reactants to react on the deposition surface. This stands in contrast to "plasma-enhanced" cyclical vapor deposition processes where use of plasma allows the precursors and/or reactants to become active species such as ions or radicals that react on a deposition surface of the substrate. In thermal cyclical vapor deposition, the layer is formed without the use of plasma assistance. In other words, the thermal cyclical vapor deposition process does not comprise exposing the substrate to active species such as ions or radicals that are generated in a plasma.

In embodiments, the thermal cyclical vapor deposition process is selected from thermal atomic layer deposition (ALD), cyclical chemical vapor deposition (cyclical CVD), and hybrid cyclical deposition processes. Hybrid cyclical deposition processes include at least one thermal ALD cycle and one cyclical CVD cycle.

In some embodiments, the thermal cyclical vapor deposition process comprises at least one thermal ALD cycle. A thermal ALD cycle for 'n' precursors/reactants is a series of 'n' steps, each involving a precursor/reactant pulse followed by a complete purge. A cyclical CVD cycle for'n' precursors/reactants is a series of 'n' steps, each involving a precursor/reactant pulse followed by an optional incomplete purge.

How thermal ALD can be done is well known to the person skilled in the art. Very briefly, thermal ALD involves the cyclical, iterative introduction of two or more precursor gases. Each precursor is introduced into the deposition chamber separately, in a defined sequence. As each precursor is introduced, it reacts with the surface of a heated substrate, a process known as chemisorption, ideally in a self-limiting manner, to form at most a monolayer. This chemisorption is facilitated by the elevated temperature of the substrate, which, ideally, is high enough to enable the surface reaction, but not so high as to cause decomposition or gas phase reactions of the precursors. Between the introduction of each precursor, the chamber is purged with an inert gas or vacuum to remove, ideally, any unreacted precursors reaction byproducts. This ensures that the next precursor, ideally, reacts solely with the chemisorbed layer on the substrate surface, and not with other precursors in the gas phase. This sequence of steps—precursor pulse, purge, next precursor pulse, purge—is repeated in an iterative fashion. Each cycle deposits a new atomic layer on the substrate, and the number of cycles determines the thickness of the film. In this way, the thin film grows incrementally, one atomic layer at a time. It is, however, well understood by the person skilled in the art that that practical implementation of thermal ALD can sometimes diverge from this idealized procedure due to various factors. For example, to optimize throughput, the process may be run outside the standard temperature window for thermal ALD. This could cause some precursor surface decomposition to occur, leading to the process not being perfectly self-limiting. However, since it is still a process that cycles for 'n' precursors/reactants is a series of 'n' steps, each involving a precursor/reactant pulse followed by a complete purge, it remains thermal ALD. Additionally, the purge times of an ALD process could be minimized, again to optimize throughput, which may result in some degree of gas phase reactions between the precursors. Here, since the purge is not complete, we will call this process a CVD process.

In certain cases, a reactant may physisorb onto the surface, catalyzing the decomposition of a pulsed precursor. This can lead to an exponentially decaying growth rate with time during each precursor pulse. While this process deviates from idealized ALD, it is still an ALD process because it is a process that cycles for 'n' precursors/reactants is a series of 'n' steps, each involving a precursor/reactant pulse followed by a complete purge.

How cyclical CVD can be done is also well known to the person skilled in the art. Very briefly, cyclical CVD involves the cyclical, iterative introduction of two or more precursor gases. Each precursor is introduced into the deposition chamber separately, in a defined sequence. As each precursor is introduced, it reacts with the surface of a heated substrate, a process known as chemisorption to form a layer. This chemisorption is facilitated by the elevated temperature of the substrate, which is carefully controlled to be high enough to enable the surface reaction, but not so high as to cause decomposition or gas phase reactions of the precursors. Between the introduction of each precursor, the chamber is either not purged or is incompletely purged with an inert gas or vacuum to remove part of the unreacted precursor and part of the reaction byproducts. This ensures that the next precursor reacts both with the chemisorbed layer on the substrate surface, and also with other precursors in the gas phase. This sequence of steps—precursor pulse, optional partial purge, next precursor pulse, optional partial purge—is repeated in an iterative fashion. Each cycle deposits a new layer on the substrate, and the thickness of the film is determined by the number of pulses and the duration of each pulse. Most preferably, the method of the first aspect comprises forming (100) the film by thermal atomic layer deposition.

In embodiments, forming (100) the film by thermal cyclical vapor deposition may comprise:

a. providing (101) a substrate on a holder within a chamber of a reactor of thermal cyclical vapor deposition system, e.g., an atomic layer deposition system, the chamber comprising:
   (i) a gas distribution system;
   (ii) the holder for the substrate,
b. heating (102) the substrate to a temperature conductive to allow a hafnium precursor, a zirconium precursor, and an oxygen source to react on a deposition surface of the substrate to form the film;
c. introducing (103), one or more times, the hafnium precursor, the zirconium precursor, and the oxygen source, into the chamber via the gas distribution system in a predetermined sequence, thereby allowing a reaction on the heated deposition surface of the substrate, thereby forming the film.

In embodiments, the method may involve heating (102) the substrate, typically to a temperature of from 100 °C to 600 °C, during the film formation.

In the first aspect, the film is formed under the effect of an electric field.

In embodiments, the electric field may be direct current, alternating current, or a combination of the two.

Preferably, the electric field may be a DC electric field.

In embodiments, the DC electric field may be a pulsed DC electric field. In other embodiments, the DC electric field may be a constant field.

In embodiments, the pulsed DC electric field may be pulsed at a frequency of from 0.5 to 10 Hz.

In embodiments, the electric field may be uniformly distributed (e.g., uniformly distributed) across a deposition surface of a substrate on which the film is being formed. This means that the electric field is uniform at least on part of the surface of the substrate on which the film is being formed. Preferably, the electric filed is uniform on 50% or more, preferably 60% or more, more preferably 70% or more, yet more preferably 80% or more, yet even more preferably 90% or more of the top surface of the substrate. Most preferably, the electric field is uniform over the entire top surface of the substrate, with the exception of minor edge effects.

In embodiments, the electric field may be perpendicular to a deposition surface of a substrate on which the film is being formed.

In embodiments, the electric field may be uniformly distributed across and perpendicular to a deposition surface of a substrate on which the film is being formed.

In embodiments, the electric field may be applied (104) at one or more of the following times:

During the first precursor pulse; during an optional purge step that follows the first precursor pulse; during the second precursor pulse, and after a vapor deposition cycle (e.g., between two ALD cycles, between two cyclical chemical vapor deposition cycles or between an ALD cycle and a cyclical chemical vapor deposition cycle).

In embodiments where ALD is used, the electric field may be applied (104) at one or more of the following times:

During the first precursor pulse; during the purge step that follows the first precursor pulse; during the second precursor pulse, and after an ALD cycle (e.g., between two ALD cycles).

In embodiments, the electric field may have a magnitude of from 0.1 MV/cm to the breakdown field of the film.

In embodiments, when the thin film exceeds a thickness of 10 nm, the electric field preferably has a magnitude of from 0.1 MV/cm to 5 MV/cm. In other embodiments, when the thin film thickness if 10 nm or lower, the electric field preferably has a magnitude of from 0.1 MV/cm to 6 MV/cm.

In embodiments, the deposition surface may measure at least 300 $cm^2$.

In embodiments, the deposition surface may measure at least 700 $cm^2$.

In embodiments, forming (100) the film may comprise:

a. providing (101) a substrate on a holder within a chamber of a reactor of a thermal cyclical vapor deposition system, e.g., an atomic layer deposition system, the chamber comprising:
   (i) a gas distribution system (6);
   (ii) a first electrically conductive component;
   (iii) the holder (4) for the substrate (5), the holder (4) comprising a second electrically conductive component (16), wherein both electrically conductive components are adapted to allow the generation of the electric field (13) between the first and the second electrically conductive component (16), uniformly across and perpendicular to a surface of the holder (4) holding the substrate (5);
b. heating (102) the substrate to a temperature conductive to allow a hafnium precursor, a zirconium precursor, and an oxygen source to react on a deposition surface of the substrate to form the film;
c. introducing (103), one or more times, the hafnium precursor, the zirconium precursor, and the oxygen source, into the chamber via the gas distribution system in a predetermined sequence, thereby allowing a reaction on the heated deposition surface of the substrate, thereby forming the film;

wherein, during step c, the electric field is generated (104) that is uniformly distributed across and perpendicular to the surface of the holder holding the substrate. This method can be characterized as comprising only ALD cycles, only cyclical CVD cycles, or as comprising both ALD cycles and cyclical CVD cycles.

The material chosen for the substrate can vary based on the design requirements of the device. It might be a semiconductor like silicon, germanium, gallium arsenide, gallium nitride, or gallium oxide; for instance, it can be a silicon or a germanium wafer; alternatively, it could be a metal electrode, such as those made from titanium nitride, tantalum nitride, tungsten, platinum, iridium, or yttrium oxide. Furthermore, dielectric materials, including hafnium oxide, zirconium oxide, silicon dioxide, aluminum oxide, lanthanum oxide, hafnium nitride, or silicon nitride can also serve as the substrate material.

Figure 8:
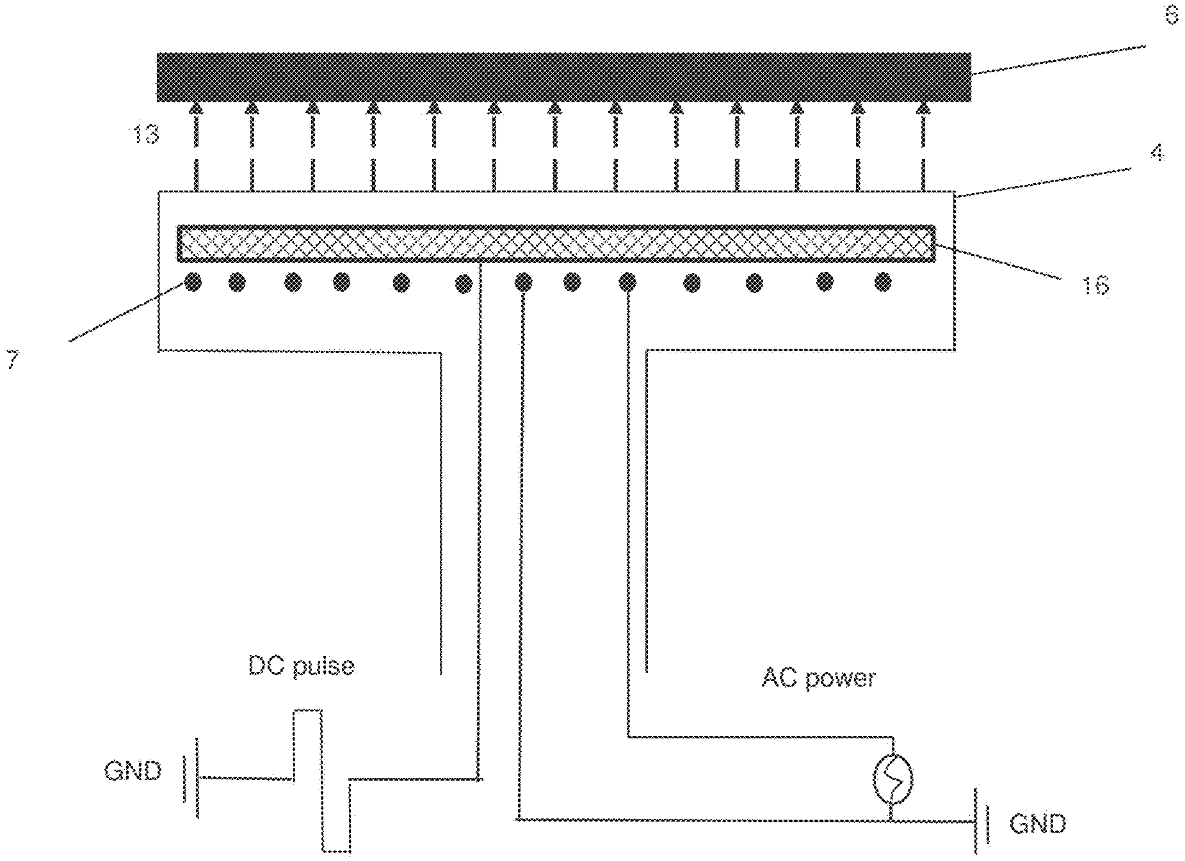
FIG. 8 shows a schematic representation of a holder for a substrate suitable for use in a thermal cyclical vapor deposition system of the present invention.

The holder (4) for the substrate can, as is well-known to the person skilled in the art of thermal cyclical vapor deposition, e.g., of thermal ALD, comprise, in addition to the second electrically conductive component (16) adapted to allow the generation of the electric field, heating elements (7) for heating the substrate. This is depicted in FIG. 8. The reactor and its chamber are both well-known to the person skilled in the art of thermal cyclical vapor deposition, e.g., of thermal atomic layer deposition.

The gas distribution system can be any distribution system as is well known to the person skilled in the art. For instance, it can be a cross-flow gas distribution system or a showerhead gas distribution system.

If the gas distribution system does not double as an electrode for allowing the generation of the electric field between the holder and the gas distribution system, for instance if the gas distribution system is a cross-flow gas distribution system, an additional electrode adapted to allow the generation of the electric field (13) uniformly across and perpendicular to a surface of the holder (4) should be used. For allowing the formation of a uniform and perpendicular electric field, the additional electrode is preferably flat, parallel to the top surface of the holder, and large enough to overlap with the entirety of a typical substrate. For instance, the additional electrode can measure at least 300 $cm^2$, or at least 700 $cm^2$.

Preferably, the gas distribution system and the first electrically conductive component may be the same and may be a showerhead gas distribution system, wherein the first and the second electrically conductive component are adapted to allow the generation of the electric field between the holder and the showerhead gas distribution system, and wherein, during step c, the electric field is generated between the holder and the showerhead gas distribution system, that is uniformly distributed across and perpendicular to the surface of the holder holding the substrate.

The showerhead distribution system typically comprises a gas Inlet, a manifold designed to evenly distribute the gas across the entire surface of the showerhead, and a showerhead comprising a flat plate for facing the holder, the flat plate comprising a plurality of gas outlets connected to the manifold. The holes are designed to create a uniform flow of gas over the substrate. The diameter of the holes can vary but is typically in the range of from 0.5 to 2 mm. The density of the holes in the showerhead can vary but is typically from 1 to 20 holes per $cm^2$. The showerhead is usually placed close to the holder to ensure uniform exposure of the substrate to the reactant gases. The distance between the plate of the showerhead and the holder is typically from 1 to 5 cm.

Preferably, the surface of the flat plate of the showerhead gas distribution measures at least 300 $cm^2$, or at least 700 $cm^2$, or at least 1500 $cm^2$, or at least 2000 $cm^2$, or at least 2500 cm 2, or about 2830 $cm^2$.

The use of a showerhead gas distribution system is advantageous for several reasons. First, it allows a uniform distribution of the precursors on the substrate. Second, as it is used as one of the electrodes for generating the electric field, and since its shape is already typically large enough to overlap with the entirety of the substrate, it also allows a uniform electric field uniformly across and perpendicular to a surface of the holder (4) holding the substrate (5). Third, as it is used as one of the electrodes, this arrangement simplify the overall system design and operation, as one does not need to install and manage a separate electrode for generating the electric field. Finally, since the substrate heater doubles as one of the electrodes, the system design is simpler, with fewer components. This reduce the chances of contamination from additional parts, like a separate electrode.

The second electrically conductive component is preferably embedded in the holder.

In embodiments, the second electrically conductive component may be an electrically conductive plate, an electrically conductive coil, or an electrically conductive grid. Preferably, it is an electrically conductive grid.

Typically, the reactor comprises a voltage controller that is electrically connected to the showerhead or, if no showerhead is used, the first electrically conductive component, while the second electrically conductive component is connected to the ground.

Figure 2:
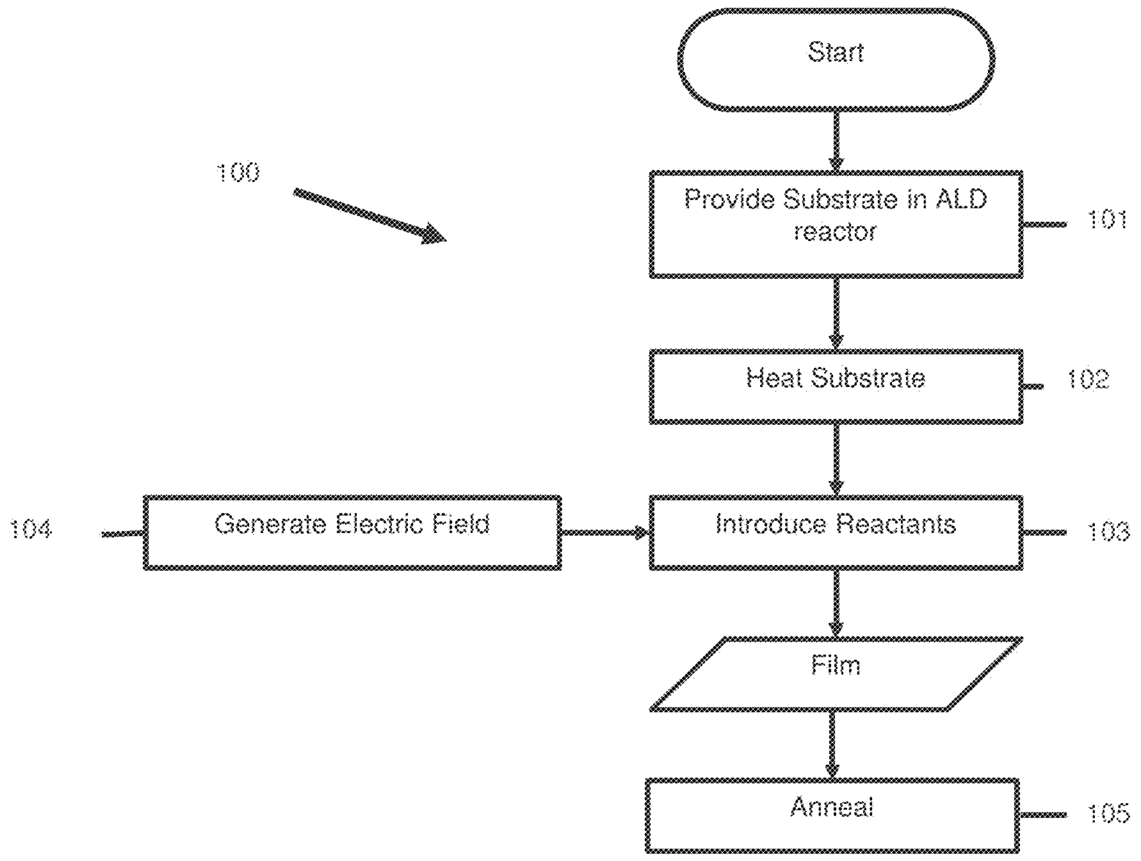

We now refer to FIG. 2. In embodiments, the method may further comprise a step of annealing (105) the film in situ after its formation.

In embodiments, the annealing temperature may be from 300 to 1000 °C In embodiments, the annealing time may be from one second to one hour.

The annealing can be performed on the holder where the deposition occurred or can be performed in a separate annealing chamber within the reactor.

Figure 4:
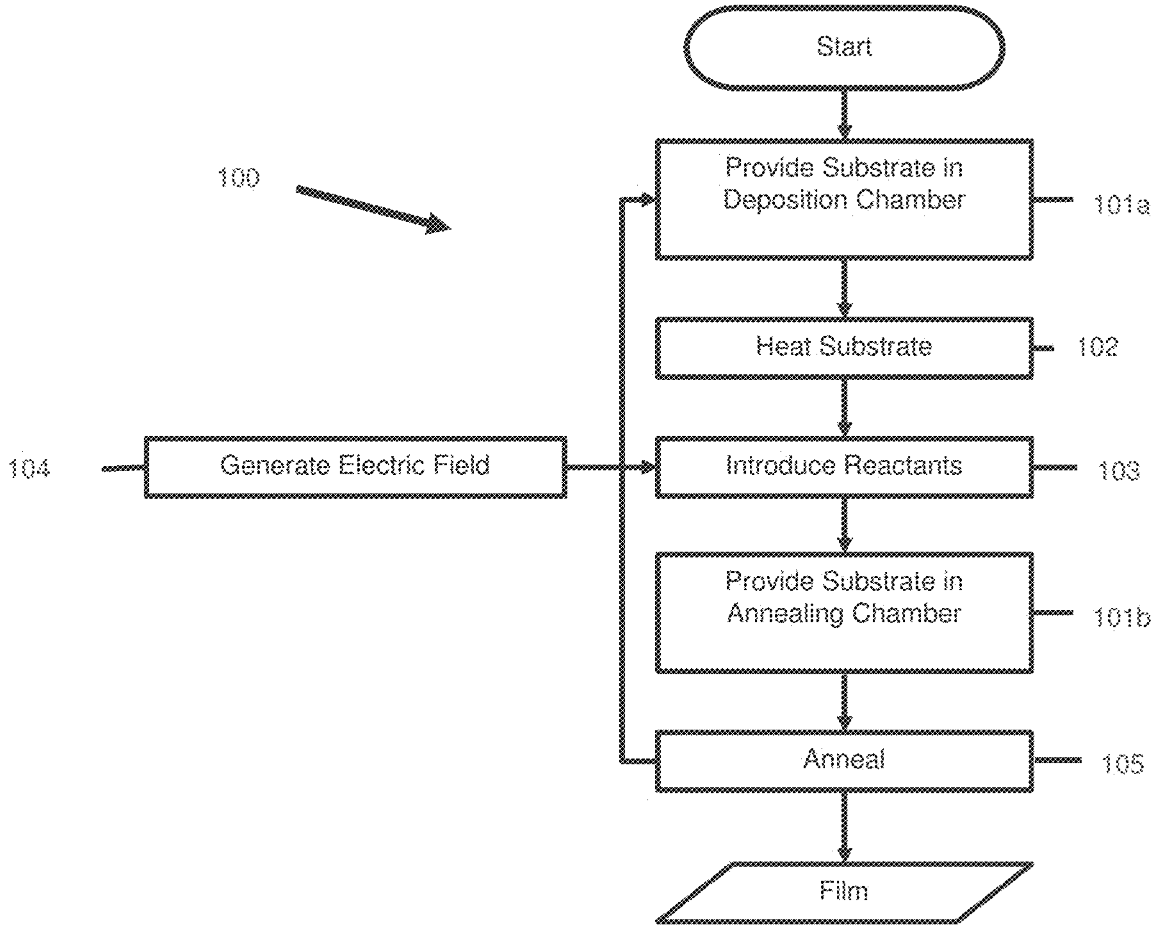

We now refer to FIG. 4. In embodiments, the step of forming the film may comprise (i) placing (101*a*) a substrate in a deposition chamber of a reactor; (ii) depositing (102, 103) one or more layers comprising hafnium, zirconium, and oxygen on the substrate in the deposition chamber by thermal cyclical vapor deposition, e.g., by thermal atomic layer deposition; after depositing the one or more layers on the substrate under the effect of the electric field, (iii) placing (101*b*) without air break the substrate in an annealing chamber of the reactor; (iv) annealing (105) the substrate in the annealing chamber; and repeating (i)-(iv) in a cycle one or more times, thereby forming the film.

Figure 3:
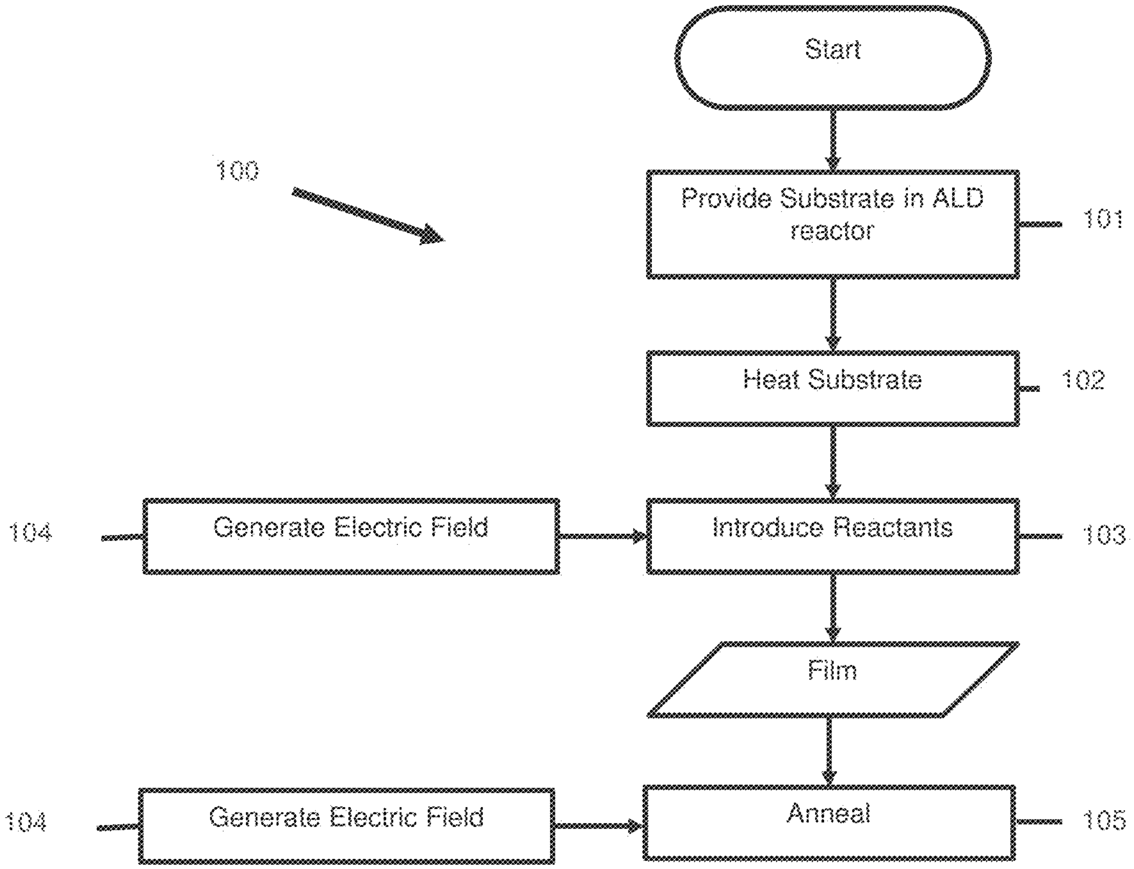
Figure 5:
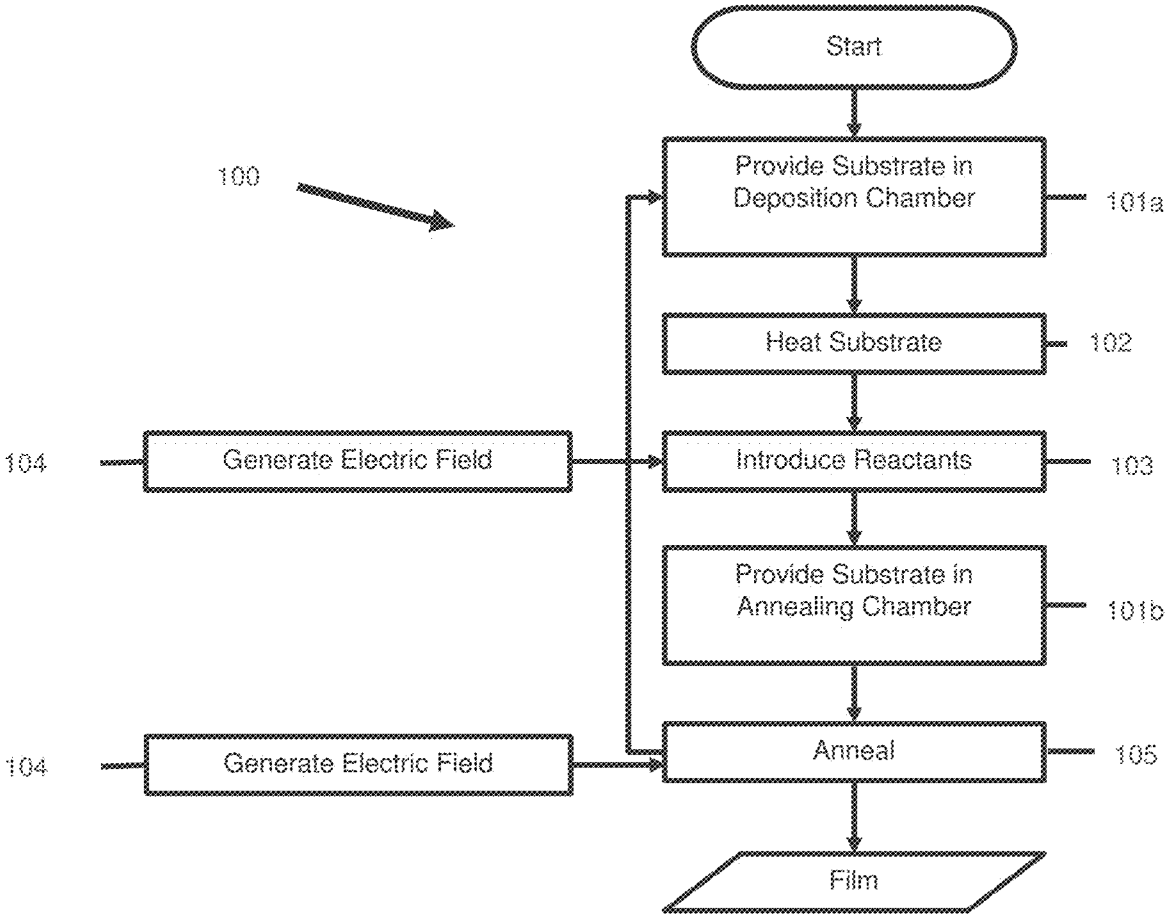

We now refer to FIGS. 3 and 5. In embodiments, the step of annealing (105) the film may be performed under the effect of an electric field. If the annealing is performed on the holder, the electric field can be generated (104) in the same way as during the deposition of the film.

If the annealing (105) is performed in a separate annealing chamber of the reactor, the annealing chamber may comprise means for exposing the substrate to an electric field.

In embodiments, the annealing chamber may comprise an outer casing, an annealing furnace support plate that is positioned within the casing, two electric field plates, one lower and one upper, set parallel to each other on either side of the support plate, and a heating unit for heating the support plate, a voltage controller that is electrically connected to one electric field plate while the other electric field plate is connected to the ground. These connections allow the formation of an electric field within the prescribed distance between the lower and upper electric field plates.

The characteristics of the electric field can be as described for the electric field generated during the film deposition.

Figure 6:
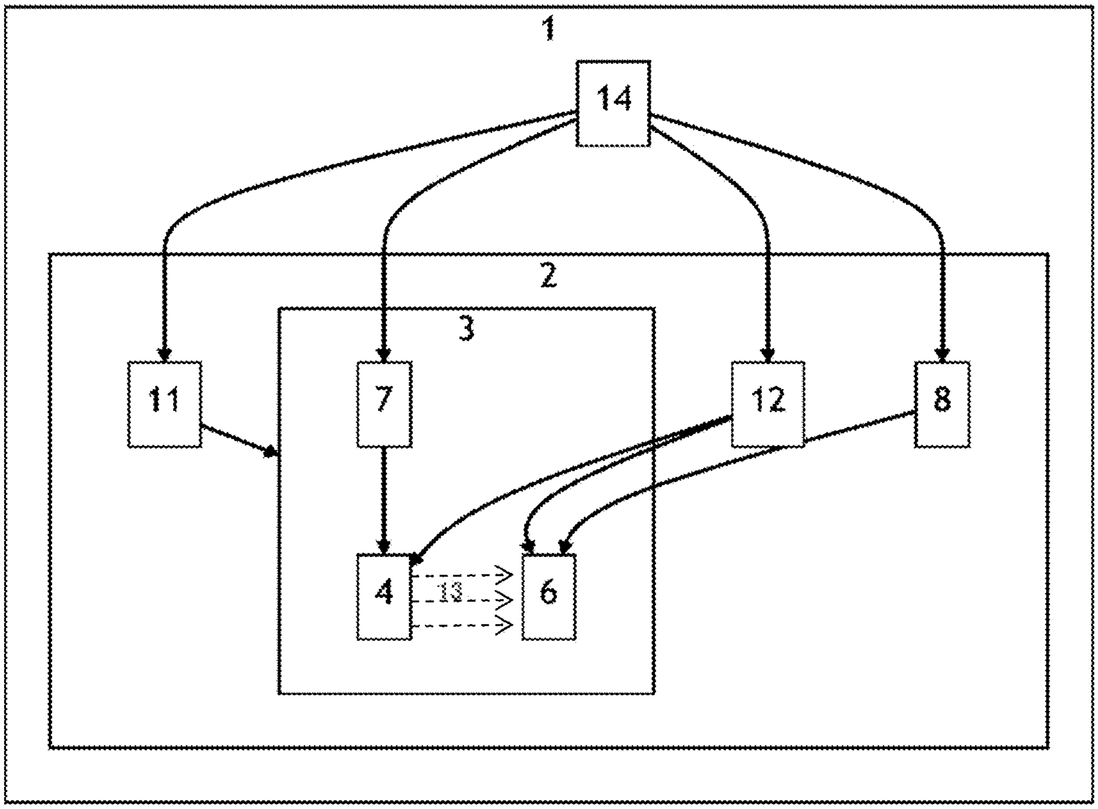
FIGS. 6 and 7 show schematic representations of thermal cyclical vapor deposition systems according to embodiments of the present invention.
Figure 7:
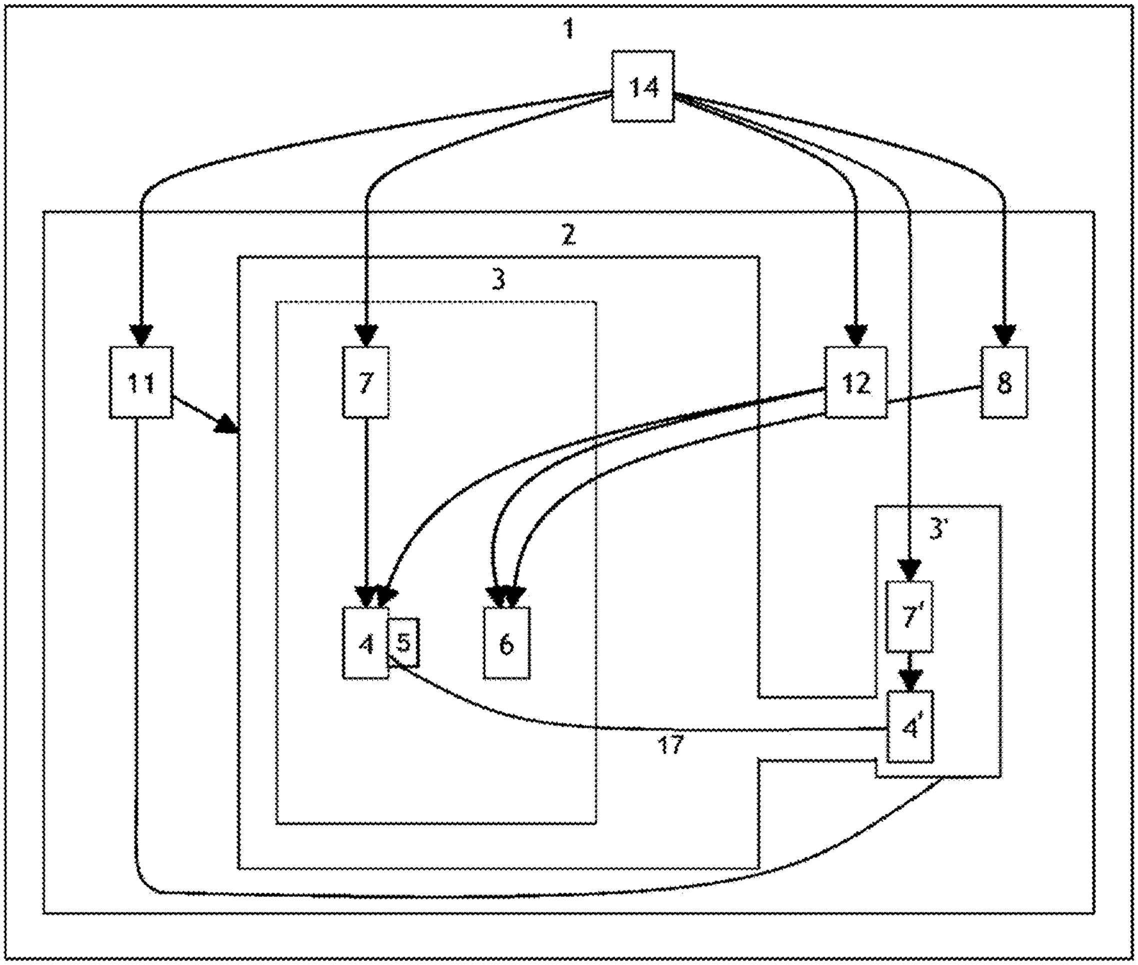

We now refer to FIG. 6. In the second aspect, the present invention relates to a thermal cyclical vapor deposition system, e.g., a thermal atomic layer deposition system (1) comprising a reactor (2) adapted for forming (100) a film comprising hafnium, zirconium, and oxygen, by thermal cyclical vapor deposition, e.g., thermal atomic layer deposition and comprising:

- an electric field generator (12) configured to generate an electric field during the formation (100) of the film; and
- a controller (14) configured to pilot the thermal cyclical vapor deposition, e.g., the thermal atomic layer deposition of the film and to operate the electric field generator (12) to generate an electric field (13) during the thermal cyclical vapor deposition, e.g., the thermal atomic layer deposition (100). When this system is capable of operating as a thermal atomic layer deposition system, it is also capable of operating as a thermal cyclical vapor deposition system.

In embodiments, the thermal cyclical vapor deposition system, e.g., the thermal atomic layer deposition system (1) may comprise:

a. the reactor (2) comprising:

a.1. a deposition chamber (3) comprising:

a.1.1. a holder (4) for a substrate (5);

a.1.2. a gas distribution system (6); and a.1.3. a heater (7) for controlling the temperature of the holder (4);

a.2. a gas delivery system (8) for delivering reactants and precursors to the gas distribution system (6);

a.3. a vacuum system (11) for controlling the pressure within the deposition chamber (3); and a.4. the electric field generator (12) configured to generate an electric field (13) uniformly across the holding surface of the holder (4);

b. the controller (14) configured to:

b.1. pilot a thermal cyclical vapor deposition system, e.g., the thermal atomic layer deposition by operating the heater (7) to supply heat to the holder (4), operating the gas delivery system (8) to introduce reactants and precursors in a predetermined sequence to the gas distribution system (6); operating the vacuum system (11) to control the pressure within the deposition chamber (3) and to optionally evacuate the deposition chamber (3) in a predetermined fashion during the thermal cyclical vapor deposition (e.g., thermal atomic layer deposition if the evacuation is performed); and b.2. operate the electric field generator (12) to generate the electric field (13) during the thermal cyclical vapor deposition, e.g. the thermal atomic layer deposition.

In FIG. 6 (and 7, see infra), the gas distribution system (6) doubles as the first electrically conductive component. In alternative embodiments (not depicted), a separate first electrically conductive component, parallel to the holder (4), is present in addition to the gas distribution system (6), and the electric field is generated between the holder (4) and the first electrically conductive component (and not the gas distribution system (6)).

In embodiments, the electric field generator may be configured to generate a pulsed DC electric field uniformly across a holding surface of the holder.

In embodiments, the reactor may comprise one or more deposition chambers (3) and one or more annealing chambers (3'), each of these chambers (3, 3') being divided into a first compartment (31) for hosting the substrate (5) during its processing, and a second compartment (32) that houses a shared intermediate space (33) between all chambers (3, 3') for shuttling the substrate (5) between adjacent chambers (3, 3'), wherein the reactor (2) further comprises a transfer mechanism (17) for shuttling the substrate (5) between adjacent chambers (3, 3') via the shared intermediate space (33), wherein each of the annealing chambers (3') comprise an annealing holder (4') and a heater (7') for controlling the temperature of the annealing holder (4'); wherein the vacuum system (11) is configured for sustaining a uniform pressure across all chambers (3, 3'), and wherein the controller (14) is further configured for performing one or more times a cycle that involves: (i) placement of the substrate (5) in a deposition chamber (3), (ii) thermal cyclical vapor deposition, e.g., thermal atomic layer deposition, of one or more layers comprising hafnium, zirconium, and oxygen on the substrate (5) in the presence of the electric field, (iii) substrate (5) shuttling without air break to an annealing chamber (3'), (iv) heating up the substrate (5) so as to anneal the one or more layers; thereby producing the film. An example of such a reactor (2), provided that an electric field generator is present and configured to generate an electric field uniformly across the holding surface of the holder (4) during step (ii) and optionally uniformly across the holding surface of the annealing holder (4') during step (iv), is described in details in US2022/0119944A1, and in particular from [0048] to [0065], which is incorporated herein by reference.

In embodiments, the gas distribution system is a showerhead gas distribution system (6), wherein the electric field generator (12) is configured to generate an electric field (13) between the holder (4) and the showerhead gas distribution system (6) uniformly across the holding surface of the holder (4).

In feature of the system of the second aspect can be as correspondingly described for the method for the method of the first aspect.

In a third aspect, the present invention relates to a computer program comprising instructions to cause the system of the second aspect to execute the steps of the method of the first aspect.

In a fourth aspect, the present invention relates to a computer-readable medium having stored thereon the computer program of the third aspect.

It is to be understood that although preferred embodiments, specific constructions and configurations, as well as materials, have been discussed herein for devices according to the present invention, various changes or modifications in form and detail may be made without departing from the scope of this invention. Steps may be added or deleted to methods described within the scope of the present invention.

The invention claimed is:

1. A method for forming a film comprising hafnium, zirconium, and oxygen, the method comprising forming the film by a thermal cyclical vapor deposition process under effect of an electric field.

2. The method according to claim 1, wherein the electric field is a DC electric field.

3. The method according to claim 2, wherein the DC electric field is a pulsed DC electric field.

4. The method according to claim 3, wherein the pulsed DC electric field is pulsed at a frequency of from 0.5 to 10 Hz.

5. The method according to claim 1, wherein the electric field is uniformly distributed across and perpendicular to a deposition surface of a substrate on which the film is being formed.

6. The method according to claim 5, wherein the deposition surface measures at least 300 $cm^2$.

7. The method according to claim 6, wherein the deposition surface measures at least 700 $cm^2$.

8. The method according to claim 5, wherein forming the film comprises:

a. providing a substrate on a holder within a chamber of a reactor of a thermal cyclical vapor deposition system, the chamber comprising:

(i) a gas distribution system;

(ii) a first electrically conductive component;

(iii) the holder for the substrate, the holder comprising a second electrically conductive component, adapted to allow generation of the electric field between the first and the second electrically conductive component, uniformly across and perpendicular to a surface of the holder holding the substrate;

b. heating the substrate to a temperature conductive to allow a hafnium precursor, a zirconium precursor, and an oxygen source to react on a deposition surface of the substrate to form the film; and c. introducing, one or more times, the hafnium precursor, the zirconium precursor, and the oxygen source, into the chamber via the gas distribution system in a predetermined sequence, thereby allowing a reaction on the deposition surface of the substrate, thereby forming the film, wherein, during step c, the electric field is generated that is uniformly distributed across and perpendicular to the surface of the holder holding the substrate.

9. The method according to claim 8, wherein the gas distribution system and the first electrically conductive component are the same and are a showerhead gas distribution system, wherein the second electrically conductive component is adapted to allow the generation of the electric field between the holder and the showerhead gas distribution system, and wherein, during step c, the electric field is generated, between the holder and the showerhead gas distribution system, that is uniformly distributed across and perpendicular to the surface of the holder holding the substrate.

10. The method according to claim 8, wherein the second electrically conductive component is an electrically conductive grid.

11. The method according to claim 1, further comprising a step of annealing the film in situ after its formation.

12. The method according to claim 11, wherein the step of forming the film comprises (i) placing a substrate in a deposition chamber of a reactor; (ii) depositing one or more layers comprising hafnium, zirconium, and oxygen on the substrate in the deposition chamber by thermal cyclical vapor deposition under the effect of the electric field; after depositing the one or more layers on the substrate, (iii) placing without air break the substrate in an annealing chamber of the reactor; (iv) annealing the substrate in the annealing chamber; and repeating (i)-(iv) in a cycle one or more times, thereby forming the film.

13. The method according to claim 11, wherein the step of annealing the film is performed under the effect of an electric field.

14. The method according to claim 1, wherein the thermal cyclical vapor deposition process comprises at least one thermal atomic layer deposition cycle.

15. The method according to claim 1, wherein the thermal cyclical vapor deposition process is a thermal atomic layer deposition.

* * * * *